(12) United States Patent
Shen et al.

(10) Patent No.: US 12,236,871 B2
(45) Date of Patent: Feb. 25, 2025

(54) PIXEL CIRCUIT AND DRIVING METHOD THEREOF, DISPLAY PANEL AND DISPLAY DEVICE

(71) Applicants: MIANYANG BOE OPTOELECTRONICS TECHNOLOGY CO., Ltd., Sichuan (CN); BOE Technology Group Co., Ltd., Beijing (CN)

(72) Inventors: Yuan Shen, Beijing (CN); Lin Xiong, Beijing (CN); Jie Tu, Beijing (CN); Zifeng Wang, Beijing (CN); Danfeng Wang, Beijing (CN); Jianmin Fan, Beijing (CN); Qing Tang, Beijing (CN)

(73) Assignees: MIANYANG BOE OPTOELECTRONICS TECHNOLOGY CO., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/028,743

(22) PCT Filed: May 19, 2022

(86) PCT No.: PCT/CN2022/093811
§ 371 (c)(1),
(2) Date: Mar. 27, 2023

(87) PCT Pub. No.: WO2023/221032
PCT Pub. Date: Nov. 23, 2023

(65) Prior Publication Data
US 2024/0363065 A1    Oct. 31, 2024

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0426* (2013.01);
(Continued)

(58) Field of Classification Search
CPC ................................................ H10K 59/00–95
See application file for complete search history.

(56) References Cited

U.S. PATENT DOCUMENTS

2019/0392748 A1* 12/2019 Ahn .................... G09G 3/3233
2020/0013331 A1    1/2020 Kaisha
(Continued)

FOREIGN PATENT DOCUMENTS

| CN | 106952618 A | 7/2017 |
| CN | 111179855 A | 5/2020 |

(Continued)

OTHER PUBLICATIONS

CN-212010325-U (Year: 2020).*

*Primary Examiner* — Sanjiv D. Patel
(74) *Attorney, Agent, or Firm* — Ling Wu; Stephen Yang; Ling and Yang Intellectual Property

(57) ABSTRACT

A pixel circuit comprises a drive sub-circuit (101), writing sub-circuit (102), reset sub-circuit (103), voltage stabilizing sub-circuit (104), storage sub-circuit (105) and light emitting element. The drive sub-circuit is configured to provide a driving current to the light emitting element under control of signals of a first node (N1) and a second node (N2); the writing sub-circuit is configured to write a signal from a data signal terminal (Data) to N2 under control of signal of a scan signal terminal (Gate); the storage sub-circuit is configured
(Continued)

to store a voltage of N1; the voltage stabilizing sub-circuit is configured to stabilize a voltage of an anode terminal of light emitting element through signal of a voltage stabilizing signal terminal (V1); the reset sub-circuit is configured to reset anode terminal of light emitting element under control of signal of Gate and reset N1 under control of signal of a reset control signal terminal (Reset).

19 Claims, 8 Drawing Sheets

(52) U.S. Cl.
CPC ............... *G09G 2300/0819* (2013.01); *G09G 2300/0842* (2013.01); *G09G 2300/0861* (2013.01); *G09G 2310/08* (2013.01); *G09G 2320/0233* (2013.01); *G09G 2320/0247* (2013.01)

(56) References Cited

U.S. PATENT DOCUMENTS

| | | |
|---|---|---|
| 2021/0035490 A1 | 2/2021 | Feng et al. |
| 2021/0304678 A1 | 9/2021 | Wang et al. |
| 2022/0051627 A1 | 2/2022 | Yang et al. |
| 2022/0262309 A1 | 8/2022 | Zhang et al. |
| 2022/0309970 A1 | 9/2022 | Yu et al. |

FOREIGN PATENT DOCUMENTS

| | | | |
|---|---|---|---|
| CN | 111341257 A | | 6/2020 |
| CN | 111489698 A | | 8/2020 |
| CN | 111599311 A | | 8/2020 |
| CN | 111986620 A | | 11/2020 |
| CN | 212010325 U | * | 11/2020 |
| CN | 112309332 A | | 2/2021 |
| CN | 113421906 A | | 9/2021 |
| CN | 113971930 A | | 1/2022 |
| EP | 4203051 A1 | | 6/2023 |

* cited by examiner

PIXEL CIRCUIT AND DRIVING METHOD THEREOF, DISPLAY PANEL AND DISPLAY DEVICE

CROSS-REFERENCE TO RELATED APPLICATION

The present application is a U.S. National Phase Entry of International Application No. PCT/CN2022/093811 having an international filing date of May 19, 2022, the content of which is incorporated into this application by reference.

TECHNICAL FIELD

Embodiments of the present disclosure relate to, but are not limited to, the field of display technologies, in particular to a pixel circuit and a driving method thereof, a display panel, and a display device.

BACKGROUND

As an active light emitting display device, an Organic Light Emitting Diode (OLED) has advantages of self-illumination, wide viewing angle, high contrast ratio, low power consumption, extremely high response speed, etc. With continuous development of display technologies, display devices using the OLED as a light emitting device and using a Thin Film Transistor (TFT) for signal control have become mainstream products in the field of display at present.

SUMMARY

The following is a summary of subject matters described herein in detail. The summary is not intended to limit the protection scope of claims.

An exemplary embodiment of the present disclosure provides a pixel circuit including a drive sub-circuit, a writing sub-circuit, a reset sub-circuit, a voltage stabilizing sub-circuit, a storage sub-circuit, and a light emitting element, wherein the drive sub-circuit is configured to provide a driving current to the light emitting element under control of signals of a first node and a second node; the writing sub-circuit is configured to write a signal of a data signal terminal to the second node under control of a signal of a scan signal terminal; the storage sub-circuit is configured to store a voltage of the first node; the voltage stabilizing sub-circuit is configured to stabilize a voltage of an anode terminal of the light emitting element through a signal of a voltage stabilizing signal terminal; the reset sub-circuit is configured to reset the anode terminal of the light emitting element under control of the signal of the scan signal terminal and reset the first node under control of a signal of a reset control signal terminal.

An exemplary embodiment of the present disclosure further provides a display panel including multiple sub-pixels, wherein at least one of the sub-pixels includes a pixel circuit as described above.

An exemplary embodiment of the present disclosure further provides a display device including a display panel and a photosensitive element, wherein the display panel includes a first display region and a second display region, the first display region at least partially surrounds the second display region, and the photosensitive element is located in the second display region;

the display panel includes multiple first light emitting elements and multiple second light emitting elements; the display panel further includes multiple first pixel circuits configured to drive the first light emitting elements to emit light and multiple second pixel circuits configured to drive the second light emitting elements to emit light;

a second pixel circuit is the pixel circuit as described above, and the second pixel circuit includes a first sub-part, which is a part other than the voltage stabilizing sub-circuit and the second light emitting element;

the first light emitting elements, the first pixel circuits and first sub-parts of the multiple second pixel circuits are located in the first display region, and the first sub-parts of the multiple second pixel circuits are distributed among the multiple first pixel circuits; and voltage stabilizing sub-circuits and the multiple second light emitting elements are located in the second display region.

An exemplary embodiment of the present disclosure further provides a method for driving a pixel circuit, which is used for driving the pixel circuit as described above and includes:

resetting, by the reset sub-circuit, the first node and the anode terminal of the light emitting element under control of signals of the reset control signal terminal and the scan signal terminal;

writing, by the writing sub-circuit, the signal of the data signal terminal into the second node under control of the signal of the scan signal terminal;

storing, by the storage sub-circuit, the voltage of the first node;

stabilizing, by the voltage stabilizing sub-circuit, the voltage of the anode terminal of the light emitting element through the signal of the voltage stabilizing signal terminal; and providing, by the drive sub-circuit, the driving current to the light emitting element under control of signals of the first node and the second node.

Other aspects may be comprehended upon reading and understanding drawings and detailed descriptions.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not constitute limitations on the technical solutions of the present disclosure. Shapes and sizes of various components in the drawings do not reflect actual scales, but are only intended to schematically illustrate contents of the present disclosure.

DETAILED DESCRIPTION

Figure 1:
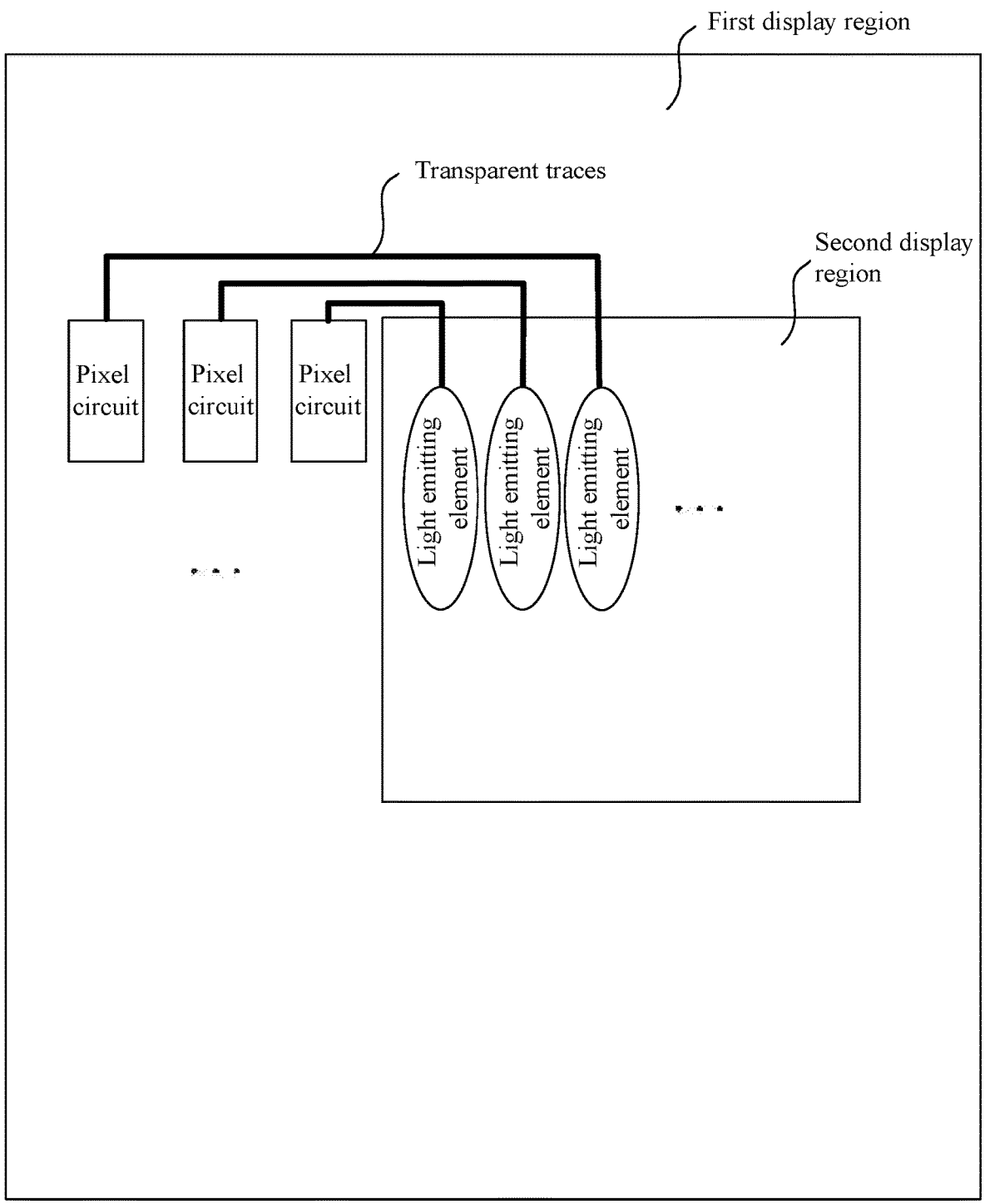
FIG. 1 is a schematic diagram of traces of an under-screen camera region.

To make objectives, technical solutions, and advantages of the present disclosure clearer, the embodiments of the present disclosure will be described in detail with reference to the accompanying drawings. It is to be noted that implementations may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other without conflict. In order to make following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to usual designs.

In the drawings, a size of a constituent element, a thickness of a layer, or a region is exaggerated sometimes for clarity. Therefore, one implementation of the present disclosure is not necessarily limited to the dimensions, and shapes and sizes of various components in the drawings do not reflect actual scales. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, or a detachable connection, or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case where constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements (such as transistors), resistors, inductors, capacitors, other elements with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

OLED display devices have many advantages such as self-luminescence, a low drive voltage, a high light emitting efficiency, short response time, and a wide operating temperature range, and are commonly recognized as a most promising display device. OLED pixels need to be driven by a current to emit light, while in the display region of a mobile display device such as mobile phone, it usually needs to set up a camera to meet different application scenarios for taking photos. The camera in the display region needs to capture the light penetrating the display region to reach the lens, so there is a high demand for the penetration rate of the display region. As shown in FIG. 1, in order to realize true full screen display, a pixel circuit of a backplane (BP) may be externally arranged in a non-Full Display with Camera (FDC) region (i.e., a first display region) usually by means of externally arranged pixel circuit+transparent traces, and a driving signal is transmitted to an anode and a light emitting element of the FDC region (i.e., a second display region) through the transparent traces to drive the anode and light emitting element of the FDC region to emit light.

However, in the FDC region, since the transparent traces are too long, signal crosstalk problem would occur between two transparent traces, that is, the alternating voltages on the two transparent traces would influence each other, which leads to Mura-class display defect on the display panel. With the increase of the resolution of the FDC region and the refresh rate of the panel, this signal crosstalk will become more serious.

Figure 2:
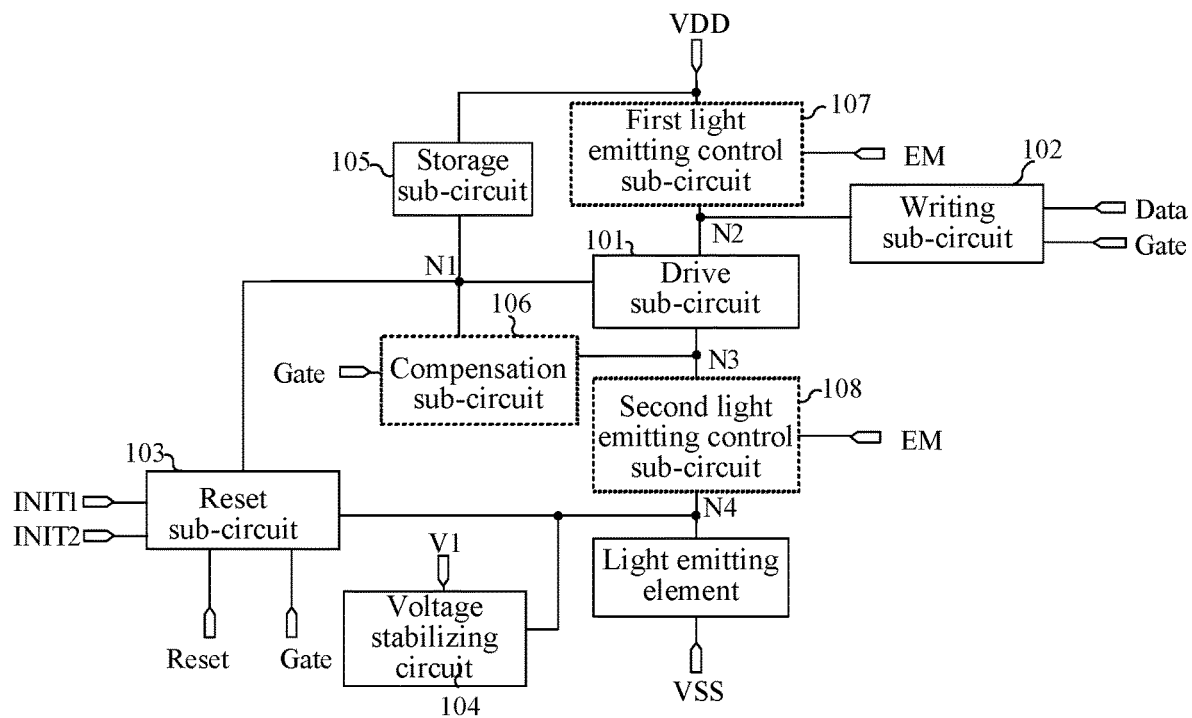
FIG. 2 is a schematic diagram of a structure of a pixel circuit according to an embodiment of the present disclosure.

An embodiment of the present disclosure provides a pixel circuit. FIG. 2 is a schematic diagram of a structure of a pixel circuit according to an embodiment of the present disclosure. As shown in FIG. 2, the pixel circuit includes a drive sub-circuit 101, a writing sub-circuit 102, a reset sub-circuit 103, a voltage stabilizing sub-circuit 104, a storage sub-circuit 105, and a light emitting element.

The drive sub-circuit 101 is connected with a first node N1, a second node N2 and a third node N3, respectively, and is configured to provide a driving current for the light emitting element under control of signals of the first node N1 and the second node N2.

The writing sub-circuit 102 is connected with a scan signal terminal Gate, a data signal terminal Data and the second node N2, respectively, and is configured to write a signal of the data signal terminal Data into the second node N2 under control of a signal of the scan signal terminal Gate.

The storage sub-circuit 105 is connected with a first voltage terminal VDD and the first node N1, respectively, and is configured to store a voltage of the first node N1 (i.e., a control terminal of the drive sub-circuit 101).

The voltage stabilizing sub-circuit 104 is connected with a voltage stabilizing signal terminal V1 and a fourth node N4, respectively, and is configured to stabilize a voltage of the fourth node N4 (i.e., an anode terminal of the light emitting element) through a signal of the voltage stabilizing signal terminal.

The reset sub-circuit 103 is connected with a reset control signal terminal Reset, the scan signal terminal Gate, the fourth node N4, and the first node N1, respectively, and is configured to reset the fourth node N4 under control of a signal of the scan signal terminal, and reset the first node N1 under control of a signal of the reset control signal terminal Reset.

One terminal of the light emitting element is connected with the fourth node N4, while the other terminal of the light emitting element is connected with a second voltage terminal VSS.

According to the pixel circuit provided by the embodiment of the present disclosure, benefitted from the voltage stabilizing sub-circuit 104, the voltage of the anode terminal of the light emitting element would not be affected by the mutual crosstalk between adjacent transparent traces, thus achieving the effect of anti-signal interference, and improving the display effect of the display panel.

In some exemplary embodiments, as shown in FIG. 2, the pixel circuit further includes a compensation sub-circuit 106.

The compensation sub-circuit 106 is connected with the scan signal terminal Gate, the first node N1 and a third node N3, respectively, and is configured to compensate a threshold voltage of a drive sub-circuit 101 under control of the signal of the scan signal terminal Gate.

In some exemplary embodiments, as shown in FIG. 2, the pixel circuit further includes a first light emitting control sub-circuit 107 and a second light emitting control sub-circuit 108.

The first light emitting control sub-circuit 107 is connected with a first voltage terminal VDD, a light emitting control signal terminal EM and the second node N2, respectively, and is configured to form a conductive path between the first voltage terminal VDD and the second node N2 under control of a signal of the light emitting control signal terminal EM.

The second light emitting control sub-circuit 108 is connected with the light emitting control signal terminal EM, the third node N3, and the fourth node N4, respectively, and is configured to form a conductive path between the third node N3 and the fourth node N4 under control of a signal of the light emitting control signal terminal EM.

Figure 3:
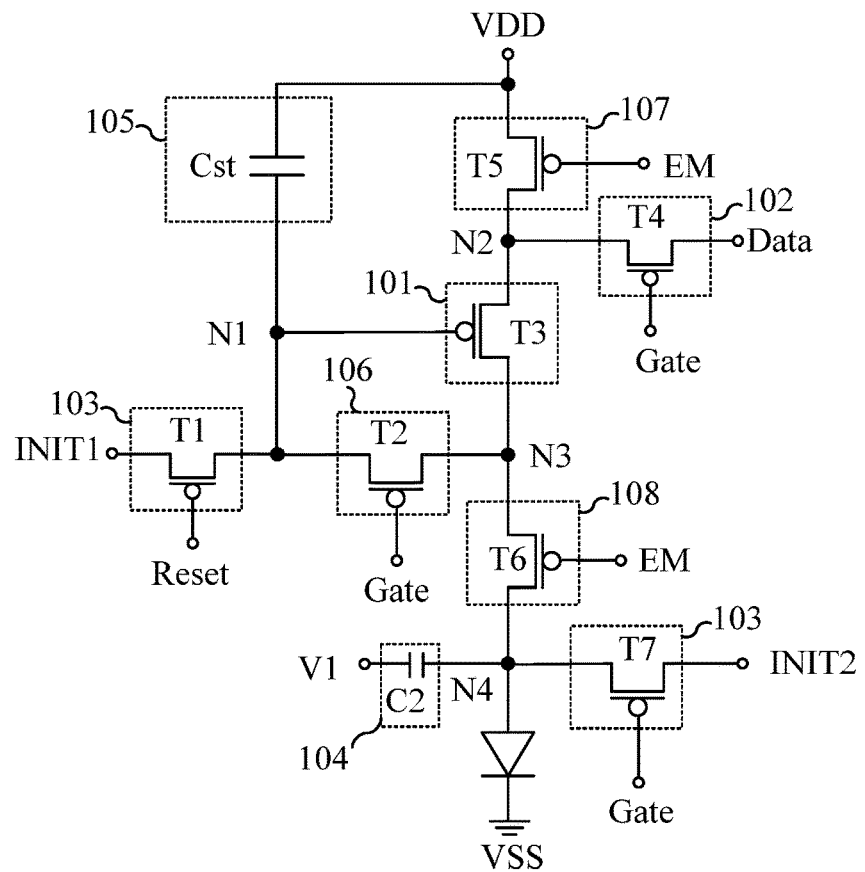
FIG. 3 is an equivalent circuit diagram of a pixel circuit according to an embodiment of the present disclosure.

In some exemplary embodiments, FIG. 3 is an equivalent circuit diagram of a pixel circuit according to an embodiment of the present disclosure. As shown in FIG. 3, the storage sub-circuit 105 includes a first capacitor Cst, and the voltage stabilizing sub-circuit 104 includes a second capacitor C2.

One terminal of the first capacitor Cst is connected with the first node N1, and the other terminal of the first capacitor Cst is connected with the first voltage terminal VDD.

One terminal of the second capacitor C2 is connected with the voltage stabilizing signal terminal V1, and the other terminal of the second capacitor C2 is connected with the fourth node N4.

FIG. 3 shows an exemplary structure of the storage sub-circuit 105 and the voltage stabilizing sub-circuit 104. Those skilled in the art can easily understand that implementations of the storage sub-circuit 105 and the voltage stabilizing sub-circuit 104 are not limited thereto as long as functions thereof can be implemented.

In some exemplary embodiments, the voltage stabilizing signal terminal V1 may be any DC signal providing terminal such as a first voltage terminal VDD, a second voltage terminal VSS, a first initial signal terminal INIT1, a second initial signal terminal INIT2, etc.

In some exemplary embodiments, as shown in FIG. 3, in the pixel circuit provided by the embodiment of the present disclosure, the compensation sub-circuit 106 includes a second transistor T2; the drive sub-circuit 101 includes a third transistor (i.e., a drive transistor) T3; and the writing sub-circuit 102 includes a fourth transistor T4.

A control electrode of the second transistor T2 is connected with the scan signal terminal Gate, a first electrode of the second transistor T2 is connected with the third node N3, and a second electrode of the second transistor T2 is connected with the first node N1.

A control electrode of the third transistor T3 is connected with the first node N1, a first electrode of the third transistor T3 is connected with the second node N2, and a second electrode of the third transistor T3 is connected with the third node N3.

A control electrode of the fourth transistor T4 is connected with the scan signal terminal Gate, a first electrode of the fourth transistor T4 is connected with the data signal terminal Data, and a second electrode of the fourth transistor T4 is connected with the second node N2.

FIG. 3 shows an exemplary structure of the compensation sub-circuit 106, the drive sub-circuit 101, and the writing sub-circuit 102. Those skilled in the art can easily understand that implementations of the compensation sub-circuit 106, the drive sub-circuit 101, and the writing sub-circuit 102 are not limited thereto as long as respective functions thereof can be achieved.

In some exemplary embodiments, as shown in FIG. 3, the first light emitting control sub-circuit 107 provided in the embodiment of the present disclosure includes a fifth transistor T5, and the second light emitting control sub-circuit includes a sixth transistor T6.

A control electrode of the fifth transistor T5 is connected with the light emitting control signal terminal EM, a first electrode of the fifth transistor T5 is connected with the first voltage terminal VDD, and a second electrode of the fifth transistor T5 is connected with the second node N2.

A control electrode of the sixth transistor T6 is connected with the light emitting control signal terminal EM, a first electrode of the sixth transistor T6 is connected with the third node N3, and a second electrode of the sixth transistor T6 is connected with the fourth node N4.

FIG. 3 shows an exemplary structure of the first light emitting control sub-circuit 107 and the second light emitting control sub-circuit 108. Those skilled in the art can easily understand that implementations of the first light emitting control sub-circuit 107 and the second light emitting control sub-circuit 108 are not limited thereto as long as respective functions thereof can be achieved.

In an exemplary embodiment, as shown in FIG. 3, the reset sub-circuit 103 provided in the embodiment of the present disclosure includes a first transistor T1 and a seventh transistor T7.

A control electrode of the first transistor T1 is connected with the reset control signal terminal Reset, a first electrode of the first transistor T1 is connected with the first node N1, and a second electrode of the first transistor T1 is connected with the first initial signal terminal INIT1.

A control electrode of the seventh transistor T7 is connected with the scan signal terminal Gate, a first electrode of the seventh transistor T7 is connected with the second initial signal terminal INIT2, and a second electrode of the seventh transistor T7 is connected with the fourth node N4.

FIG. 3 shows an exemplary structure of the reset sub-circuit 103. Those skilled in the art can easily understand that an implementation of the reset sub-circuit 103 is not limited thereto as long as a function thereof can be achieved.

In some exemplary embodiments, as shown in FIG. 3, in the pixel circuit provided in the embodiment of the present disclosure, the storage sub-circuit 105 includes a first capacitor Cst, the voltage stabilizing sub-circuit 104 includes a second capacitor C2, the compensation sub-circuit 106 includes a second transistor T2, the drive sub-circuit 101 includes a third transistor T3, and the writing sub-circuit 102 includes a fourth transistor T4, the first light emitting control sub-circuit 107 includes a fifth transistor T5, the second light emitting control sub-circuit 108 includes a sixth transistor T6, and the reset sub-circuit 103 includes a first transistor T1 and a seventh transistor T7.

One terminal of the first capacitor Cst is connected with the first node N1, and the other terminal of the first capacitor Cst is connected with the first voltage terminal VDD. One terminal of the second capacitor C2 is connected with the voltage stabilizing signal terminal V1, and the other terminal of the second capacitor C2 is connected with the fourth node N4. A control electrode of the second transistor T2 is connected with the scan signal terminal Gate, a first electrode of the second transistor T2 is connected with a third node N3, and a second electrode of the second transistor T2 is connected with a first node N1. A control electrode of the third transistor T3 is connected with the first node N1, a first electrode of the third transistor T3 is connected with the second node N2, and a second electrode of the third transistor T3 is connected with the third node N3. A control electrode of the fourth transistor T4 is connected with the scan signal terminal Gate, a first electrode of the fourth transistor T4 is connected with the data signal terminal Data, and a second electrode of the fourth transistor T4 is connected with the second node N2. A control electrode of the fifth transistor T5 is connected with the light emission control signal terminal EM, a first electrode of the fifth transistor T5 is connected with the first voltage terminal VDD, and a second electrode of the fifth transistor T5 is connected with the second node N2. A control electrode of the sixth transistor T6 is connected with the light emitting control signal terminal EM, a first electrode of the sixth transistor T6 is connected with the third node N3, and a second electrode of the sixth transistor T6 is connected with the fourth node N4. A control electrode of the first transistor T1 is connected with the reset control signal terminal Reset, a first electrode of the first transistor T1 is connected with the first node N1, and a second electrode of the first transistor T1 is connected with the first initial signal terminal INIT1. A control electrode of the seventh transistor T7 is connected with the scan signal terminal Gate, a first electrode of the seventh transistor T7 is connected with the second initial signal terminal INIT2, and a second electrode of the seventh transistor T7 is connected with the fourth node N4. One terminal of the light emitting element is connected with the fourth node N4, and the other terminal of the light emitting element is connected with the second voltage terminal VSS.

FIG. 3 shows an exemplary structure of the drive sub-circuit 101, the writing sub-circuit 102, the compensation sub-circuit 106, the storage sub-circuit 105, the voltage stabilizing sub-circuit 104, the first light emitting control sub-circuit 107, the second light emitting control sub-circuit 108, and the reset sub-circuit 103. Those skilled in the art can easily understand that an implementation of the above sub-circuits is not limited thereto as long as respective functions thereof can be implemented.

In some exemplary embodiments, the light emitting element EL may be an Organic light emitting Diode (OLED) or a light emitting diode of any other type. In some examples, the light emitting element may be a Quantum Dot Light Emitting Diode (QLED), a Micro Light Emitting Diode (Micro-LED), or a Mini Diode (Mini-LED).

In some exemplary embodiments, the first transistor T1 to the seventh transistor T7 may be any one of the P-type transistor and the N-type transistor.

In some exemplary embodiments, the first transistor T1 to the seventh transistor T7 may all be N-type thin film transistors or P-type thin film transistors, and the first transistor T1 to the seventh transistor T7 are the same type of transistors, which may unify the process flow, reduce the process of preparation, and help improve the yield of the product.

In some exemplary embodiments, the first capacitor Cst and the second capacitor C2 may be a liquid crystal capacitor formed by a pixel electrode and a common electrode, or may be an equivalent capacitor of a storage capacitor and a liquid crystal capacitor formed by a pixel electrode and a common electrode, and this is not restricted in the present disclosure.

In some exemplary embodiments, the first initial signal terminal INIT1 and the second initial signal terminal INIT2 may be a total initial signal terminal INIT, or two independent and separate initial signal terminals. By dividing the first initial signal terminal INIT1 and the second initial signal terminal INIT2 into two independent initial signal terminals, the reset voltage of the light emitting element and the reset voltage of the first node N1 may be respectively adjusted, thereby achieving a better display effect and improving problems such as low-frequency flicker.

In some exemplary embodiments, among the first transistor T1 to the seventh transistor T7, some may be Low Temperature Poly Silicon (LTPS) Thin Film Transistor (TFTs), and some may be Indium Gallium Zinc Oxide (IGZO) TFTs.

In this embodiment, compared with LTPS TFTs, IGZO TFTs generate less leakage current. Therefore, by setting some transistors as IGZO TFTs, the generation of leakage current may be significantly reduced, and by combining the good switching characteristics of LTPS-TFT with the low leakage characteristics of Oxide-TFT, low-frequency driving (1 Hz~60 Hz) may be realized and the power consumption of the display screen may be greatly reduced.

Figure 4:
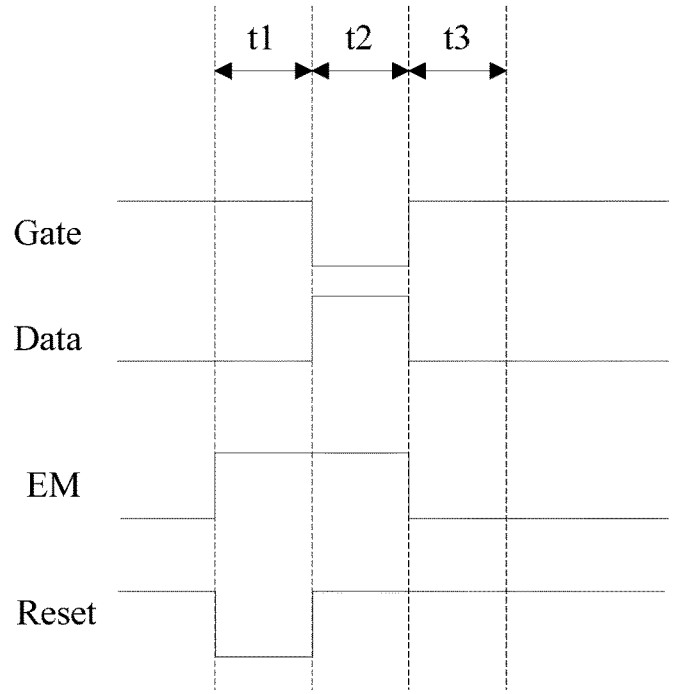
FIG. 4 is a working timing diagram of a pixel circuit according to an embodiment of the present disclosure.

Taking a pixel circuit provided by an embodiment of the present disclosure, in which all of the first transistor T1 to the seventh transistor T7 are P-type thin film transistors and the voltage stabilizing signal terminal V1 is a first voltage terminal VDD, as an example, in combination with the pixel circuit unit shown in FIG. 3 and the working timing diagram shown in FIG. 4, a working process of the pixel circuit unit in one frame period is described in detail, and the technical solution of the embodiment of the present disclosure is further illustrated through the working process of the driving circuit.

The pixel circuit provided in this embodiment includes seven transistor units (T1 to T7), two capacitor units (Cst and C2), and four power supply signal terminals (VDD, VSS, INIT1 and INIT2), wherein the first voltage terminal VDD keeps providing a high-level signal, and the second voltage terminal VSS keeps providing a low-level signal. In an exemplary embodiment, a working process of the pixel circuit in one frame period includes the following stages t1 to t3.

In a first stage t1, which is referred to as an initialization stage, signals of a scan signal terminal Gate and a light emitting control signal terminal EM are both high-level signals, and a signal of a reset control signal terminal Reset is a low-level signal. The first transistor T1 is turned on, and a signal of the first initial signal terminal INIT1 is provided to the first node N1 to initialize the first capacitor Cst and clear an original data voltage in the first capacitor. The second transistor T2, the third transistor T3, the fourth transistor T4, the fifth transistor T5, the sixth transistor T6 and the seventh transistor T7 are turned off, and the OLED does not emit light in this stage.

In a second stage t2, which is referred to as a data writing stage or a threshold compensation stage, a signal of the scan signal terminal Gate is a low-level signal, signals of the reset control signal terminal Reset and the light emitting control signal terminal EM are both high-level signals, and the data signal terminal Data outputs a data voltage. In this stage, since a second terminal of the first capacitor Cst is a low level, the third transistor T3 is turned on. A signal of the scan signal terminal Gate is a low level signal, so that the second transistor T2, the fourth transistor T4 and the seventh transistor T7 are turned on. The second transistor T2 and the fourth transistor T4 are turned on, so that the data voltage $V_{data}$ output by the data signal terminal Data is provided to the first node N1 through the second node N2, the turned-on third transistor T3, the third node N3, and the turned-on second transistor T2, and the first capacitor Cst is charged with a sum of the data voltage $V_{data}$ output by the data signal terminal Data and a threshold voltage Vth of the third transistor T3, that is, the voltage of the second terminal (the first node N1) of the first capacitor Cst is $V_{data}$+Vth, where $V_{data}$ is the data voltage output by the data signal terminal Data, and Vth is the threshold voltage of the third transistor T3. A gate-source voltage difference of the third transistor $V_{gs}=V_{DTFT\_G}-Vdd=V_{data}+Vth-Vdd$, where Vdd is a power supply voltage output by the first voltage terminal VDD. The seventh transistor T7 is turned on, so that an initialization voltage of the second initial signal terminal INIT2 is provided to a first electrode of the OLED to initialize (reset) the first electrode of the OLED and clear a pre-stored voltage therein, thereby completing initialization, that is, $V_{N4}=V_{init2}$. The signal of the reset control signal terminal Reset is a high-level signal, so that the first transistor T1 is turned off. The signal of the light emitting control signal terminal EM is a high-level signal, so that the fifth transistor T5 and the sixth transistor T6 are turned off, and the OLED does not emit light.

In a third stage t3, which is referred to as a light emitting stage, the signal of the light emitting control signal terminal EM is a low-level signal, and the signals of the scan signal terminal Gate and the reset control signal terminal Reset are both high-level signals. The signal of the light emitting control signal terminal EM is a low-level signal, so that the fifth transistor T5 and the sixth transistor T6 are turned on. A power supply voltage output by the first voltage terminal VDD provides a drive voltage to the first electrode of the OLED through the turned-on fifth transistor T5, third transistor T3 and sixth transistor T6, and the OLED emits light for a driving current flowing through it.

In the third stage t3, while charging the fourth node N4, the second capacitor C2 is charged. When the light emitting element stably emits light, the two terminals of the second capacitor C2 maintain a fixed potential difference due to the existence of the second capacitor C2, so that the fourth node N4 will not be affected by crosstalk of adjacent transparent traces, thus achieving the effect of anti-signal interference.

When OLED just emits light, the driving current Id is:

$$Id = \frac{1}{2} * \mu * C_{ox} * \frac{W}{L} * (V_{gs} - V_{th})^2 = \frac{k}{2}(V_{data} - Vdd)^2;$$

Where Id is a driving current flowing through the third transistor T3, that is, a driving current of the drive transistor (DTFT), W is a width of a channel of the third transistor T3, L is a length of the channel of the third transistor T3, W/L is a width-length ratio of the channel of the third transistor T3 (i.e., ratio of width to length), μ is a electron mobility, $C_{ox}$ is a capacitance per unit area, K is a constant, $V_{gs}$ is a voltage difference between the gate electrode and the first electrode of the third transistor T3, $V_{th}$ is a threshold voltage of the third transistor T3, and $V_{data}$ is a data voltage output from the data signal terminal Data.

It may be seen from the above formula that the current I flowing through the light emitting element EL is unrelated to the threshold voltage Vth of the third transistor T3, so that an influence of the threshold voltage Vth of the third transistor T3 on the current I is eliminated, and uniformity of brightness is ensured.

Based on the above-mentioned operating timing, the pixel circuit eliminates residual positive charges of the light emitting element after the light emitting element emitted light last time, implements compensation for a gate voltage of a driving transistor, avoids an influence of drift of a threshold voltage of the driving transistor on a driving current of the light emitting element EL, and improves uniformity of a displayed image and display quality of a display panel.

An embodiment of the present disclosure further provides a display panel, a display region of the display panel is provided with multiple sub-pixels, and the pixel circuit according to any embodiment of the present disclosure is provided in at least one of the multiple sub-pixels.

Figure 5:
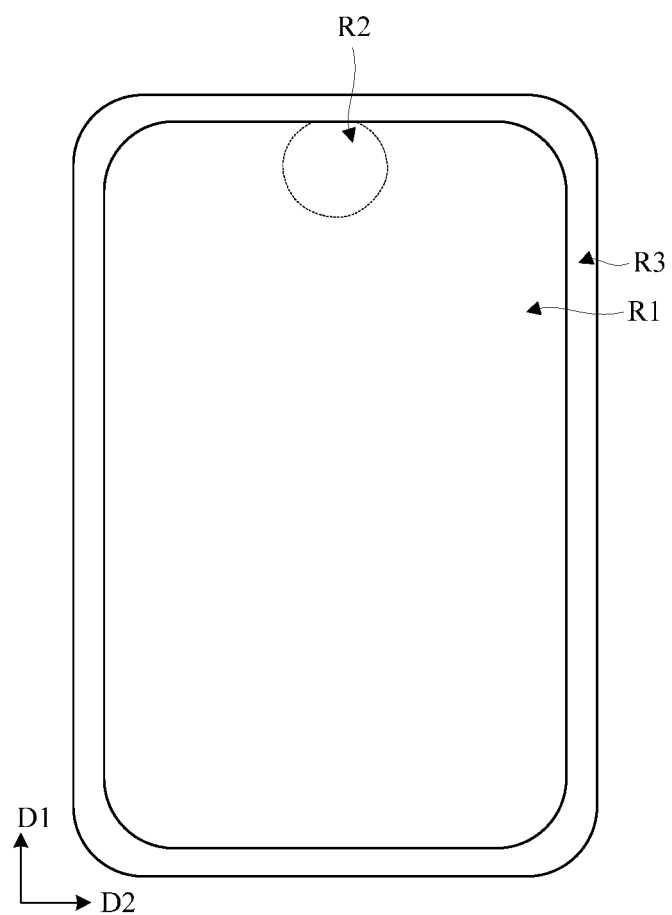
FIG. 5 is a schematic diagram of a structure of a display panel according to an embodiment of the present disclosure.

FIG. 5 is a schematic diagram of a display panel according to at least one embodiment of the present disclosure. In some exemplary embodiments, as shown in FIG. 5, the display panel includes a display region and a bezel region R3 located at a periphery of the display region. The bezel region R3 surrounds the display region. The display region includes a first display region R1 and a second display region R2, and the first display region R1 at least partially surrounds the second display region R2. For example, the second display region R2 shown in FIG. 5 is located at a top middle position of the display panel, and one side of the second display region R2 is adjacent to the bezel region R3. However, this embodiment is not limited thereto. For example, the second display region R2 may be located at another position such as an upper left corner position or an upper right corner position of the display panel.

In some exemplary embodiments, as shown in FIG. 5, the display region may be of a shape of a rectangle, e.g., a rectangle with rounded corners. The second display region R2 may be circular. However, this embodiment is not limited thereto. For example the second display region R2 may be of a shape of a rectangle, an ellipse, or the like.

In some exemplary embodiments, the first display region R1 may be a non-transmissive display region and the second display region R2 may be a transmissive display region. That is, the first display region R1 is not light-transmissive, and the second display region R2 is light-transmissive. For example, an orthographic projection of hardware such as a photosensitive sensor (such as a camera) on the display panel may be located in the second display region R2 of the display panel. In this example, the display panel does not need to be punched, and under a premise of ensuring practicability of the display panel, a true full screen may be achieved.

In some exemplary embodiments, the display panel may include multiple sub-pixels provided on the base substrate. At least one sub-pixel includes a pixel circuit and a light emitting element. The pixel circuit is configured to drive the light emitting element. For example, the pixel circuit is configured to provide a driving current to drive the light emitting element to emit light. For example, the light emitting element may be an Organic Light Emitting Diode (OLED), and the light emitting element emits red light, green light, blue light, or white light, etc. under drive of its corresponding pixel circuit. A color of light emitted from the light emitting element may be determined as required. In some examples, the light emitting element may include a first electrode (e.g. an anode), a second electrode (e.g. a cathode) and an organic light emitting layer disposed between the first and second electrodes. The first electrode may be connected with the pixel circuit. However, this embodiment is not limited thereto. In some examples, the light emitting element may be a Quantum Dot Light Emitting Diode (QLED), a Micro Light Emitting Diode (Micro-LED), or a Mini Diode (Mini-LED).

In some exemplary embodiments, a pixel unit may include three sub-pixels (for example, a red sub-pixel R, a blue sub-pixel B, and a green sub-pixel G), and the three sub-pixels may be arranged side by side horizontally, side by side vertically, or in a manner like a Chinese character "品". For example, a pixel unit may include four sub-pixels (a red sub-pixel R, a blue sub-pixel B, a green sub-pixel G, and a white sub-pixel), and the four sub-pixels may be arranged side by side horizontally, side by side vertically, or in a manner to form a square. However, the embodiments of the present disclosure are not limited to this.

In some exemplary embodiments, in order to improve a light transmittance of the second display region R2, only the light emitting element may be arranged in the second display region R2, and the pixel circuit for driving the light emitting element of the second display region R2 is arranged in the first display region R1. That is, the light transmittance of the second display region R2 is improved by separately arranging the light emitting element and the pixel circuit. In this example, in the second display region R2, no pixel circuit is provided.

Figure 6:
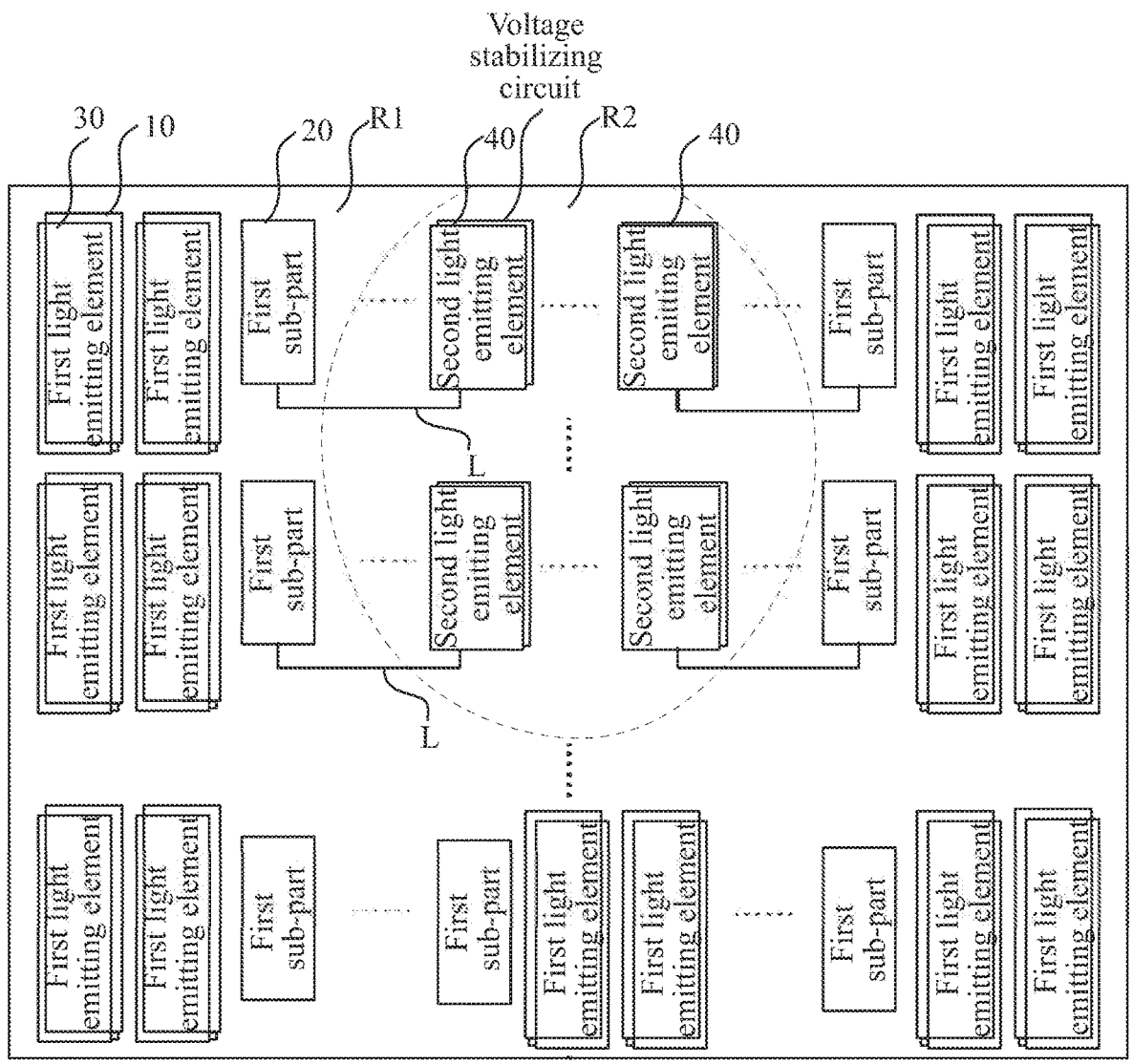
FIG. 6 is a schematic diagram of a partial structure of a display panel according to an embodiment of the present disclosure.

FIG. 6 is a schematic diagram of a partial structure of a display panel according to at least one embodiment of the present disclosure. In some exemplary embodiments, as shown in FIG. 6, the display panel includes multiple first pixel circuits 10 located in a first display region R1, first sub-parts of multiple second pixel circuits 20 (the first sub-part is a part of the second pixel circuits 20 other than a voltage stabilizing sub-circuit and a second light emitting element), multiple first light emitting elements 30, and multiple second light emitting elements 40 and a voltage stabilizing sub-circuit located in the second display region R2. The first sub-parts in the multiple second pixel circuits 20 may be distributed among the multiple first pixel circuits 10 at intervals; for example, the multiple first pixel circuits 10 are arranged between the first sub-parts of two adjacent second pixel circuits 20 in a first direction. At least one first pixel circuit 10 of the multiple first pixel circuits 10 may be connected with at least one first light emitting element 30 of the multiple first light emitting elements 30, and an orthographic projection of at least one first pixel circuit 10 on the base substrate may at least partially overlap with an orthographic projection of at least one first light emitting element 30 on the base substrate. The first pixel circuit 10 may be configured to provide a drive signal to the first light-emitting element 30 with which the first pixel circuit 10 is connected, to drive the first light-emitting element 30 to emit light. At least one second pixel circuit 20 of the multiple second pixel circuits 20 is connected with at least one second light emitting element 40 of the multiple second light emitting elements 40 through a conductive line L. The second pixel circuit 20 may be configured to provide a drive signal to the second light emitting element 40 with which the second pixel circuit 20 is connected, to drive the second light emitting element 40 to emit light. Since the second light emitting element 40 and the first sub-part are located in different regions, there is no overlapping portion between an orthographic projection of the first sub-part of the at least one second pixel circuit 20 on the base substrate and an orthographic projection of the at least one second light emitting element 40 on the base substrate.

In some exemplary embodiments, a density of second light emitting elements 40 in the second display region R2 may be approximately equal to a density of first light emitting elements 30 of the first display region R1. That is, a resolution of the second display region R2 may be approximately the same as that of the first display region R1. However, this embodiment is not limited thereto. For example, a density of the second light emitting elements 40 may be larger or smaller than that of the first light emitting elements 30. That is, the resolution of the second display region R2 may be larger or smaller than that of the first display region R1.

In some exemplary embodiments, a light emitting area of a second light emitting element 40 may be smaller than a light emitting area of a first light emitting element 30. That is, the light emitting area of the first light emitting element 30 is larger than that of the second light emitting element 40. A light emitting area of a light emitting element may correspond to an area of an opening of a pixel definition layer. In some examples, in the second display region R2, a transmissive region is provided between adjacent second light emitting elements 40. For example, multiple transmissive regions are connected with each other to form a continuous transmissive region separated by multiple second light emitting elements 40. The conductive line L may be made of a transparent conductive material to improve a light transmittance of the transmissive region as much as possible.

In some exemplary embodiments, in the first display region R1, a region where a second pixel circuit 20 is provided may be obtained by reducing a size of a first pixel circuit 10 in a second direction D2. For example, the size of the first pixel circuit 10 in the second direction D2 may be smaller than a size of a first light emitting element 30 in the second direction D2. The second direction D2 is, for example, a sub-pixel row direction, but it is not limited to this. In other embodiments, the second direction D2 may be a sub-pixel column direction. This exemplary embodiment will be described by taking the second direction D2 being the sub-pixel row direction as an example. For example, sizes of the first pixel circuit 10 and the second pixel circuit 20 in the second direction D2 may be the same, and a size of each pixel circuit in the second direction D2 may differ from the size of the first light emitting element 30 in the second direction D2 by about 4 microns (µm). A size of each pixel circuit in a first direction D1 is approximately the same as that of the first light emitting element 30 in the first direction D1. The first direction D1 is perpendicular to the second direction D2.

In some exemplary embodiments, the first pixel circuit 10 and the second pixel circuit 20 may each be the pixel circuit described in any embodiment of the present disclosure, for example, the first pixel circuit 10 and the second pixel circuit 20 may each be the pixel circuit shown in FIG. 3.

In some other exemplary embodiments, the first pixel circuit 10 may be the pixel circuit in some other embodiments, and the second pixel circuit 20 may be the pixel circuit described in any embodiment of the present disclosure. For example, the first pixel circuit 10 may be 3T1C, 7T1C, 8T1C, etc., which is not limited by the present disclosure, and the second pixel circuit 20 may be the pixel circuit shown in FIG. 3.

As shown in FIG. 6, due to the long trace of the conductive line L, the signal crosstalk problem will occur between two conductive lines L, that is, the alternating voltages on the two conductive lines L will influence each other, resulting in Mura-class defect, and such crosstalk will become more serious as the resolution of the second display region R2 and the panel refresh rate increase. Therefore, by providing a voltage stabilizing sub-circuit in the second pixel circuit 20, the anode terminal of the light emitting element may be prevented from crosstalk by the adjacent conductive line L, thereby achieving the effect of anti-signal interference. In the first display region R1, the first pixel circuit 10 is connected with the first light emitting element 30 through punching, so that the voltage stabilizing sub-circuit may not be provided in the first pixel circuit 10.

Figure 7:
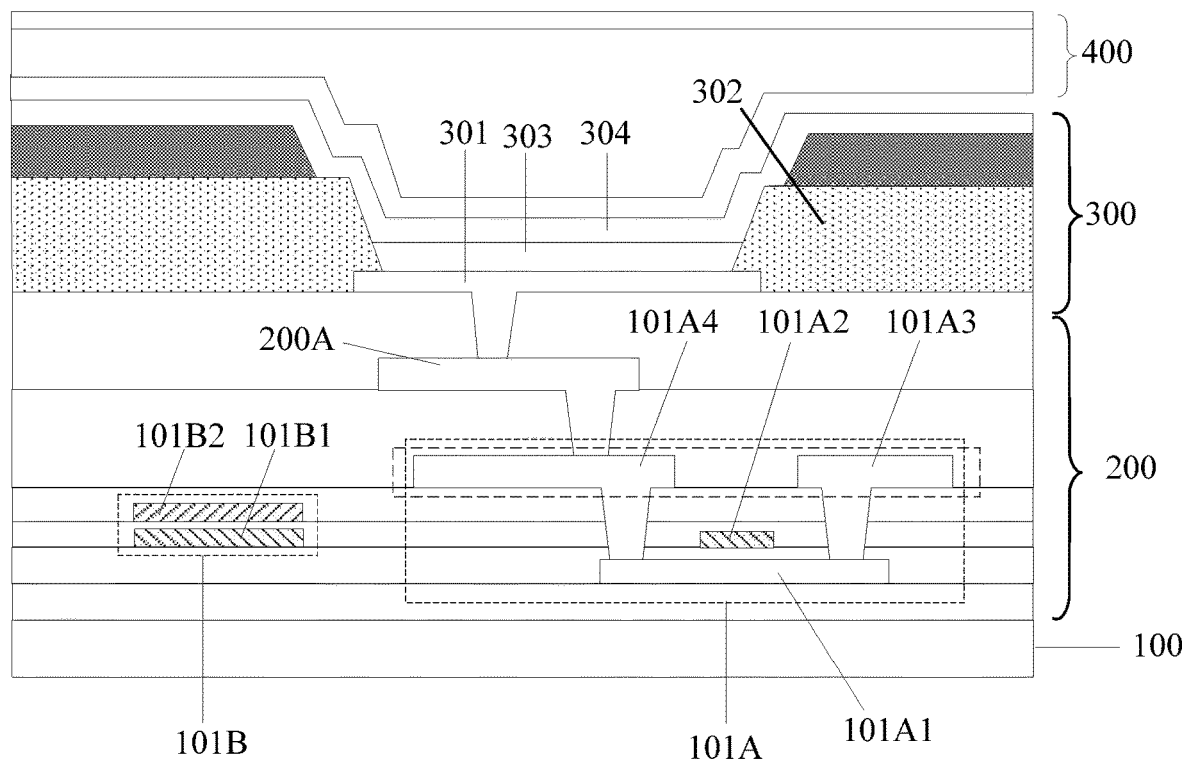
FIG. 7 is a schematic diagram of a sectional structure of a display panel according to an embodiment of the present disclosure.

FIG. 7 is a schematic diagram of a sectional structure of a display panel according to an exemplary embodiment of the present disclosure, which illustrates a structure of a sub-pixel in the display panel of the OLED. As shown in FIG. 7, on a plane perpendicular to the display panel, the display panel may include a drive circuit layer 200 disposed on a base substrate 100, a light emitting structure layer 300 disposed on a side of the drive circuit layer 200 away from the base substrate 100, and an encapsulation layer 400 disposed on a side of the light emitting structure layer 300 away from the base substrate 100. In some possible implementations, the display panel may include another film layer, such as a post spacer, which is not limited in the present disclosure.

In some exemplary implementations, the base substrate 100 may be a flexible substrate or a rigid substrate. The driving circuit layer 200 of each sub-pixel may include multiple transistors and a storage capacitor forming a pixel circuit. In FIG. 7, only a transistor 101A and a storage capacitor 101B are taken as an example. The transistor 101A includes an active layer 101A1, a gate electrode 101A2, a source electrode 101A3, and a drain electrode 101A4. The source electrode 101A3 and the drain electrode 101A4 are respectively connected with two terminals of the active layer 101A1. The storage capacitor 101B includes a first plate 101B1 and a second plate 101B2. On a plane perpendicular to the display panel, the drive circuit layer 200 may include an active layer, a first gate metal layer, a second gate metal layer, a first source-drain metal layer, and a second source-drain metal layer that are sequentially stacked on the base substrate 100. The first electrode plate 101B1 and the gate electrode 101A2 may be located on the first gate metal layer, the second electrode plate 101B2 may be located on the second gate metal layer, the source electrode 101A3 and the drain electrode 101A4 may be located on the first source-drain metal layer, and a connection electrode 200A may be located on the second source-drain metal layer. The light emitting structure layer 300 may include an anode 301, a pixel definition layer 302, an organic light emitting layer 303, and a cathode 304. The anode 301 is connected to a drain electrode 101A4 of the drive transistor 101A through the connection electrode 200A. The pixel definition layer 302 includes a first opening exposing the anode 301. The organic light emitting layer 303 is connected with the anode 301. The cathode 304 is connected with the organic light emitting layer 303. The organic light emitting layer 303 is driven by the anode 301 and the cathode 304 to emit light of a corresponding color. The encapsulation layer 400 may include a first encapsulation layer, a second encapsulation layer, and a third encapsulation layer that are stacked, the first encapsulation layer and the third encapsulation layer may be made of an inorganic material, the second encapsulation layer may be made of an organic material, and the second encapsulation layer is disposed between the first encapsulation layer and the third encapsulation layer to ensure that external water vapor cannot enter the light emitting structure layer 300.

In some exemplary embodiments, the organic emitting layer 303 may include a Hole Injection Layer (HIL), a Hole Transport Layer (HTL), an Electron Block Layer (EBL), an Emitting Layer (EML), a Hole Block Layer (HBL), an Electron Transport Layer (ETL), and an Electron Injection Layer (EIL) which are stacked. In an exemplary implementations, hole injection layers of all sub-pixels may be a common layer connected together, electron injection layers of all the sub-pixels may be a common layer connected together, hole transport layers of all the sub-pixels may be a common layer connected together, electron transport layers of all the sub-pixels may be a common layer connected together, hole block layers of all the sub-pixels may be a common layer connected together, emitting layers of adjacent sub-pixels may be overlapped slightly or may be isolated from each other, and electron block layers of adjacent sub-pixels may be overlapped slightly or may be isolated from each other.

Figure 8:
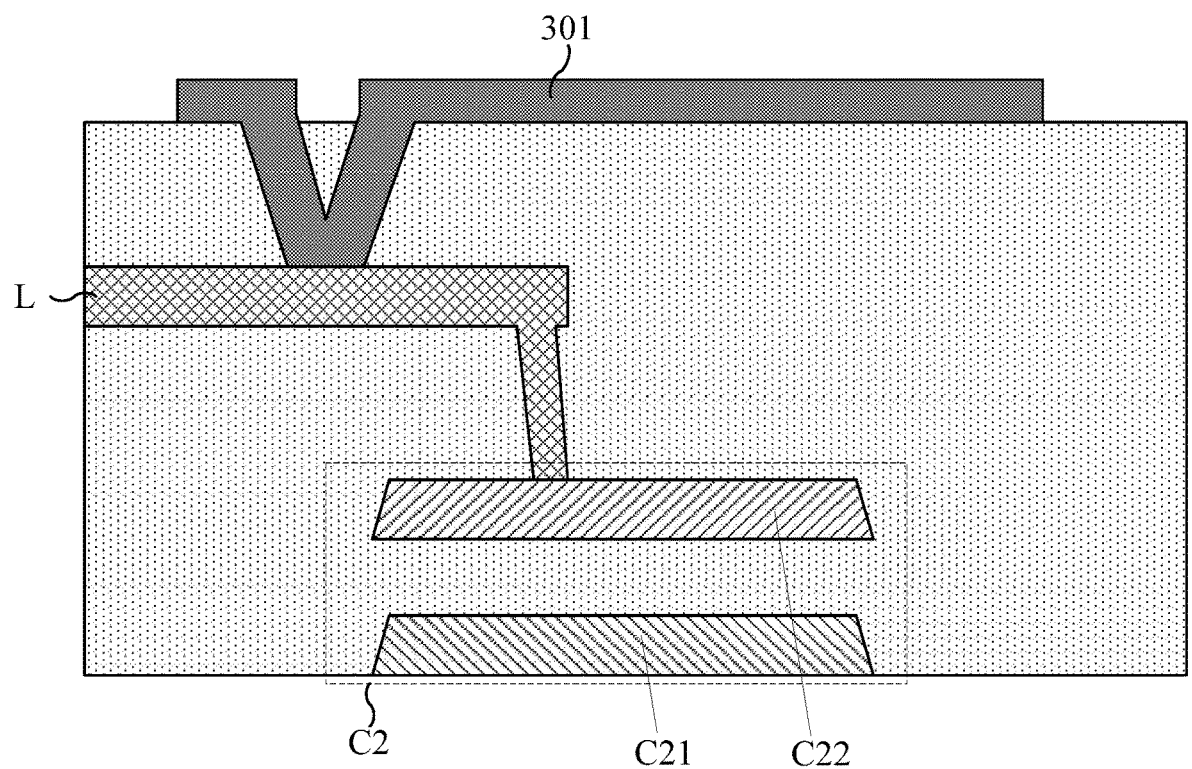
FIG. 8 is a schematic diagram of a sectional structure of a type of second capacitor according to an embodiment of the present disclosure.

In some exemplary embodiments, the drive circuit layer 200 includes multiple conductive layers between the base substrate 100 and the anode 301 on a plane perpendicular to the display panel. As shown in FIG. 8, the voltage stabilizing sub-circuit includes a second capacitor C2 including a first electrode plate C21 located on one of the multiple conductive layers and a second electrode plate C22 located on another of the multiple conductive layers.

In some exemplary embodiments, the multiple conductive layers include an active layer (Poly), a gate metal layer (Gate), and a source-drain metal layer (SD) that are sequentially provided on the base substrate.

In some exemplary embodiments, the multiple conductive layers further include a light shielding layer (BSM) provided between the base substrate and the active layer (Poly). The gate metal layer (Gate) may include at least one of a first gate metal layer (Gate1) and a second gate metal layer (Gate2); and the source-drain metal layer (SD) includes at least one of a first source-drain metal layer (SD1) and a second source-drain metal layer (SD2).

Figure 9A:
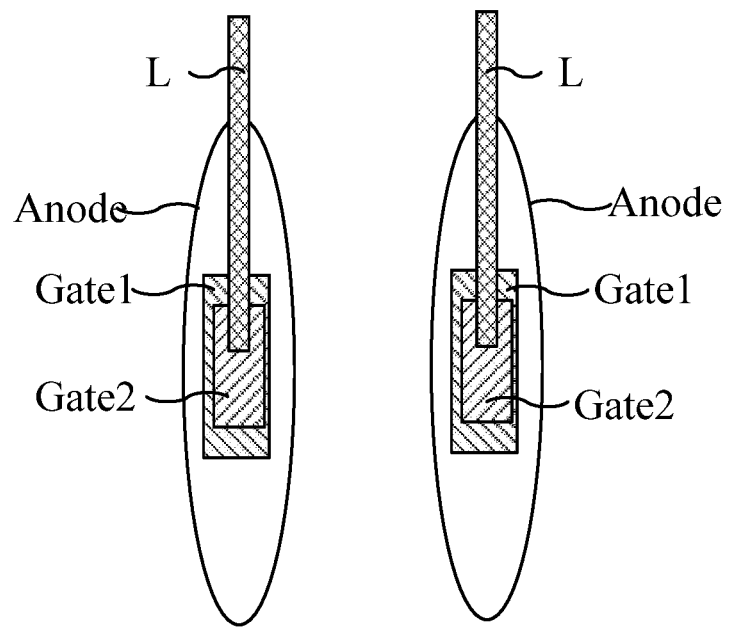
FIGS. 9A to 9C are schematic diagrams of planar structures of three types of second capacitors according to embodiments of the present disclosure.
Figure 9B:
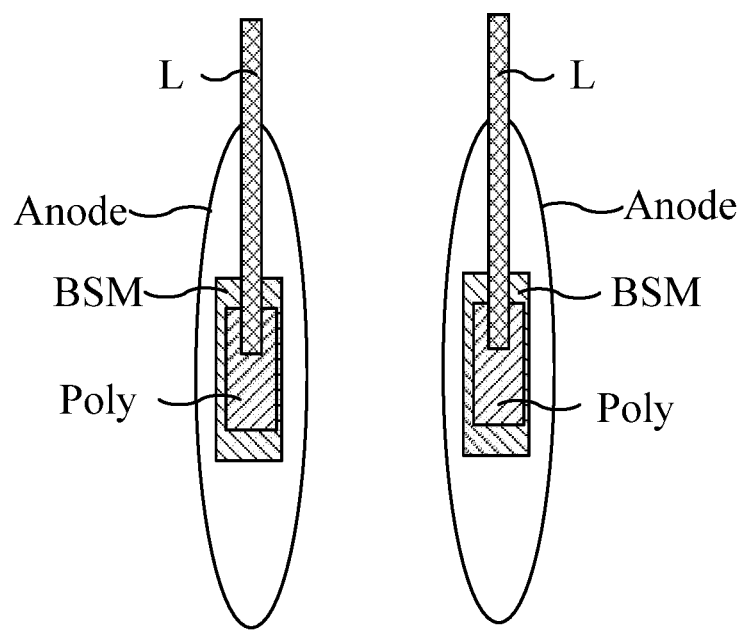

Exemplarily, as shown in FIG. 9A, the first electrode plate C21 may be located on the first gate metal layer and the second electrode plate C22 may be located on the second gate metal layer. Alternatively, as shown in FIG. 9B, the first electrode plate C21 may be located on the light shielding layer and the second electrode plate C22 may be located on the active layer. However, the present disclosure is not limited thereto.

In some exemplary embodiments, an orthographic projection of the first electrode plate C21 on the base substrate 100 is within the range of an orthographic projection of the anode 301 on the base substrate 100, and an orthographic projection of the second electrode plate C22 on the base substrate 100 is within the range of an orthographic projection of the anode 301 on the base substrate 100.

To ensure the panel transmittance of the second display region R2, the second capacitor C2 needs to be designed below the anode 301 in the second display region (i.e., a side of the anode 301 facing the base substrate 100), and the second capacitor C2 is completely covered by the anode 301. Considering that the source-drain metal layer is close to the anode and the transparent conductive layer, the conductive layer below the source-drain metal layer may be selected to form the second capacitor to increase the flatness of the anode. In FIG. 9A, two conductive layers, Gate1 and Gate2, are selected to form a second capacitor to stabilize the anode signal of the light emitting element, thereby reducing signal crosstalk. In some LTPO display products, the display panel includes a light shielding layer BSM provided on a base substrate. Therefore, two conductive layers, BSM and Poly layer, are selected in FIG. 9B to form a second capacitor C2 to stabilize the anode signal of the light emitting element, thereby reducing signal crosstalk.

Figure 9C:
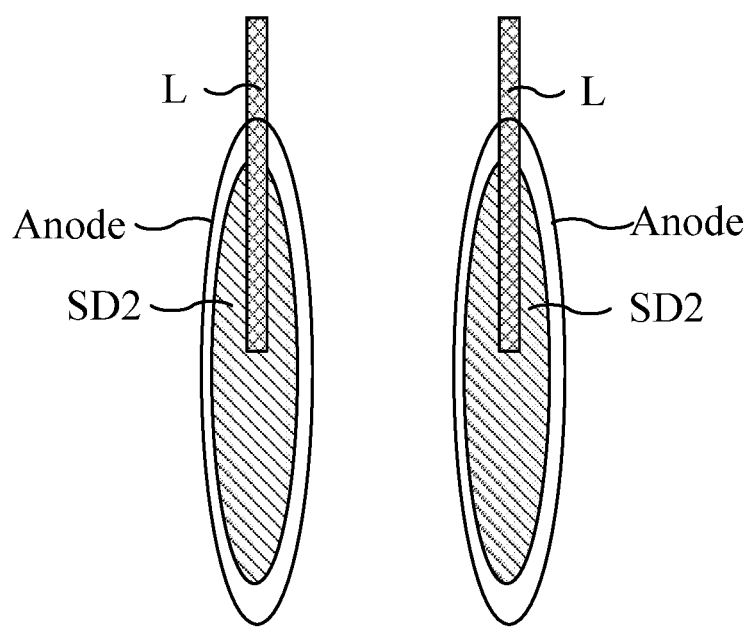

In some exemplary embodiments, the drive circuit layer 200 includes multiple conductive layers between the base substrate 100 and the anode 301 on a plane perpendicular to the display panel; the second capacitor C2 includes a first electrode plate C21 located on one of the multiple conductive layers and a second electrode plate C22 integrally provided with the anode 301. Exemplarily, as shown in FIG. 9C, the first electrode plate C21 may be located on the second source-drain metal layer and the second electrode plate C22 may be located on the anode layer, which, however, is not limited in the present disclosure.

In some exemplary embodiments, an orthographic projection of the first electrode plate C21 on the base substrate 100 is within a range of an orthographic projection of the anode 301 on the base substrate 100.

In some exemplary embodiments, the first electrode plate C21 and the anode 301 have the same shape. As shown in FIG. 9C, both the first electrode plate C21 and the anode 301 have an elliptical shape, and the symmetry of the anode may be ensured by designing the topography of the first electrode plate C21 and the anode 301 to be similar in shape.

An embodiment of the present disclosure further provides a display device including a display panel and a photosensitive element, wherein the display panel includes a first display region and a second display region, the first display region at least partially surrounds the second display region, and the photosensitive element is located in the second display region.

The display panel includes multiple first light emitting elements and multiple second light emitting elements; the display panel further includes multiple first pixel circuits configured to drive the first light emitting elements to emit light and multiple second pixel circuits configured to drive the second light emitting elements to emit light.

The second pixel circuit is the pixel circuit according to any embodiment of the present disclosure, and the second pixel circuit includes a first sub-part, which is a part other than the voltage stabilizing sub-circuit and the second light emitting element.

The first light emitting elements, the first pixel circuits and the first sub-parts of the multiple second pixel circuits are located in the first display region, and the first sub-parts of the multiple second pixel circuits are distributed among the multiple first pixel circuits.

The voltage stabilizing sub-circuit and the multiple second light emitting elements are located in the second display region.

With the rapid development of the information age, the manufacturing industries for such as mobile phones and computers have also developed rapidly. In order to realize full-screen display, sensors for camera shooting, fingerprint recognition and face recognition are usually integrated under the screen, so a concept of under-screen functional area appears, that is, sensing functions such as camera shooting and distance sensing are set under the screen. The display device according to the embodiment of the present disclosure may not only be light-transmissive but also display in the second display region by providing a photosensitive element in the second display region, which is convenient for realizing the design of under-screen integration of the photosensitive element and the full-screen display, and may be applied to under-screen camera shooting, fingerprint or face recognition and the like. The display device of the present disclosure may be any product or component with a display function, such as a mobile phone, a tablet computer, a television, a display, a laptop computer, a digital photo frame, or a navigator. In an exemplary embodiment, the display device may be a wearable display device which may be worn on a human body in some manners, such as a smart watch and a smart bracelet.

An embodiment of the present disclosure further provides a method for driving a pixel circuit, which is applied to the pixel circuit provided in any one of the preceding embodiments and includes: resetting, by a reset sub-circuit, a first node and a fourth node under control of signals of a reset control signal terminal and a scan signal terminal; writing, by a writing sub-circuit, a signal of a data signal terminal into a second node under control of a signal of the scan signal terminal; storing, by a storage sub-circuit, a voltage of the first node; stabilizing, by a voltage stabilizing sub-circuit, a voltage of the fourth node (i.e., an anode terminal of the light emitting element) through a signal of a voltage stabilizing signal terminal; and providing, by a drive sub-circuit, a driving current to the light emitting element under control of signals of the first node and the second node.

In an exemplary embodiment, the driving method further includes the following acts:

in a reset stage, the reset sub-circuit resets the first node under control of a signal of a reset control signal terminal;

in a data writing stage, the writing sub-circuit writes a signal of the data signal terminal into the second node under control of a signal of the scan signal terminal; the compensation sub-circuit compensates a threshold voltage of the drive sub-circuit to the first node under control of a signal of the scan signal terminal; and the storage sub-circuit stores a voltage of the control terminal of the drive sub-circuit;

in a light emitting stage, the first light emitting control sub-circuit forms a conductive path between the first voltage terminal and the second node under control of a signal of the light emitting control signal terminal; the drive sub-circuit provides a driving current for the third node under control of signals of the first node and the second node; and the second light emitting control sub-circuit forms a conductive path between the third node and the fourth node under control of a signal of the light emitting control signal terminal; the voltage stabilizing sub-circuit stabilizes a voltage of the fourth node (i.e. an anode terminal of the light emitting element) through a signal of the voltage stabilizing signal terminal.

According to the technical solutions provided by the embodiments of the present disclosure, benefitted from the voltage stabilizing sub-circuit, the voltage of the anode terminal of the light emitting element would not be affected by the mutual crosstalk between adjacent transparent traces, thus achieving the effect of anti-signal interference and improving the display effect of the display panel.

The drawings of the present disclosure only involve structures involved in the present disclosure, and other structures may refer to conventional designs. The embodiments in the present disclosure, i.e., features in the embodiments, may be combined with each other to obtain new embodiments if there is no conflict.

Those of ordinary skills in the art should understand that modifications or equivalent replacements of the technical solutions of the present disclosure may be made without departing from the spirit and scope of the technical solutions of the present disclosure, and shall all fall within the scope of the claims of the present disclosure.

The invention claimed is:

1. A pixel circuit, comprising a drive sub-circuit, a writing sub-circuit, a reset sub-circuit, a voltage stabilizing sub-circuit, a storage sub-circuit and a light emitting element, wherein the drive sub-circuit is configured to provide a driving current to the light emitting element under control of signals of a first node and a second node;

the writing sub-circuit is configured to write a signal of a data signal terminal to the second node under control of a signal of a scan signal terminal;

the storage sub-circuit is configured to store a voltage of the first node;

the voltage stabilizing sub-circuit is configured to stabilize a voltage of an anode terminal of the light emitting element through a signal of a voltage stabilizing signal terminal; and the reset sub-circuit is configured to reset the anode terminal of the light emitting element under control of the signal of the scan signal terminal and reset the first node under control of a signal of a reset control signal terminal;

the pixel circuit further comprises a compensation sub-circuit, a first light emitting control sub-circuit and a second light emitting control sub-circuit, wherein the compensation sub-circuit is configured to compensate a threshold voltage of the drive sub-circuit under control of the signal of the scan signal terminal;

the first light emitting control sub-circuit is configured to form a conductive path between a first voltage terminal and the second node under control of a signal of a light emitting control signal terminal;

the second light emitting control sub-circuit is configured to form a conductive path between a third node and a fourth node under control of the signal of the light emitting control signal line; and one terminal of the light emitting element is connected with the fourth node, and the other terminal of the light emitting element is connected with a second voltage terminal;

the voltage stabilizing sub-circuit comprises a second capacitor;

the drive sub-circuit comprises a third transistor;

the first light emitting control sub-circuit comprises a fifth transistor;

the second light emitting control sub-circuit comprises a six transistor;

in a light emitting stage, the signal of the light emitting control signal terminal is a low-level signal, and the signal of the scan signal terminal and the signal of the reset control signal terminal are both high-level signals; the signal of the light emitting control signal terminal is the low-level signal, so that the fifth transistor and the sixth transistor are turned on; a power supply voltage output by the first voltage terminal provides a drive voltage to a first electrode of the light emitting element through the turned-on fifth transistor, third transistor and sixth transistor, and the light emitting element emits light;

in the light emitting stage, while charging the fourth node, the second capacitor is charged; when the light emitting element stably emits light, two terminals of the second capacitor maintain a fixed potential difference, so that the fourth node is not be affected by crosstalk of adjacent transparent traces.

2. The pixel circuit according to claim 1, wherein the storage sub-circuit comprises a first capacitor;
one terminal of the first capacitor is connected with the first node, and the other terminal of the first capacitor is connected with the first voltage terminal;
one terminal of the second capacitor is connected with the voltage stabilizing signal terminal, and the other terminal of the second capacitor is connected with the fourth node.

3. The pixel circuit according to claim 2, wherein the voltage stabilizing signal terminal is any one of the following: a first voltage terminal, a second voltage terminal, and an initial signal terminal.

4. The driving circuit according to claim 2, wherein the writing sub-circuit comprises a fourth transistor, wherein
a control electrode of the third transistor is connected with the first node, a first electrode of the third transistor is connected with the second node, and a second electrode of the third transistor is connected with the third node; and
a control electrode of the fourth transistor is connected with the scan signal terminal, a first electrode of the fourth transistor is connected with the data signal terminal, and a second electrode of the fourth transistor is connected with the second node.

5. The pixel circuit according to claim 4, wherein the compensation sub-circuit comprises a second transistor, the reset sub-circuit comprises a first transistor and the seventh transistor;
a control electrode of the second transistor is connected with the scan signal terminal, a first electrode of the second transistor is connected with the third node, and a second electrode of the second transistor is connected with the first node;
a control electrode of the fifth transistor is connected with the light emitting control signal terminal, a first electrode of the fifth transistor is connected with the first voltage terminal, and a second electrode of the fifth transistor is connected with the second node;
a control electrode of the sixth transistor is connected with the light emitting control signal terminal, a first electrode of the sixth transistor is connected with the third node, and a second electrode of the sixth transistor is connected with the fourth node;
a control electrode of the first transistor is connected with the reset control signal terminal, a first electrode of the first transistor is connected with the first node, and a second electrode of the first transistor is connected with a first initial signal terminal; and
a control electrode of the seventh transistor is connected with the scan signal terminal, a first electrode of the seventh transistor is connected with a second initial signal terminal, and a second electrode of the seventh transistor is connected with the fourth node.

6. A display panel, comprising a plurality of sub-pixels, wherein at least one of the plurality of sub-pixels comprises the pixel circuit according to claim 1.

7. The display panel according to claim 6, wherein the display panel comprises a first display region and a second display region, the first display region at least partially surrounds the second display region;
the display panel comprises a plurality of first light emitting elements and a plurality of second light emitting elements; the display panel further comprises a plurality of first pixel circuits configured to drive first light emitting elements to emit light and a plurality of second pixel circuits configured to drive second light emitting elements to emit light;
a second pixel circuit is the pixel circuit, and the second pixel circuit comprises a first sub-part which is a part other than the voltage stabilizing sub-circuit and a second light emitting element;
the first light emitting elements, the first pixel circuits and first sub-parts of the second pixel circuits are located in the first display region, and first sub-parts of a plurality of second pixel circuits are distributed among a plurality of first pixel circuits; and
the voltage stabilizing sub-circuit and the second light emitting element are located in the second display region.

8. The display panel according to claim 6, wherein on a plane perpendicular to the display panel, the display panel comprises a drive circuit layer provided on a base substrate, a light emitting structure layer provided on a side of the drive circuit layer away from the base substrate, and an encapsulation layer provided on a side of the light emitting structure layer away from the base substrate; the light emitting structure layer comprises an anode, a pixel definition layer, an organic light emitting layer, and a cathode;
the drive circuit layer comprises a plurality of conductive layers located between the base substrate and the anode; when at least one of the sub-pixels comprises the pixel circuit, the voltage stabilizing sub-circuit of the pixel circuit comprises a second capacitor, and the second capacitor comprises a first electrode plate and a second electrode plate, wherein the first electrode plate is located on one of the plurality of conductive layers, and the second electrode plate is located on another one of the plurality of conductive layers; the storage sub-circuit of the pixel circuit comprises a first capacitor, one terminal of the first capacitor is connected with the first node, and the other terminal of the first capacitor is connected with the first voltage terminal; one terminal of the second capacitor is connected with the voltage stabilizing signal terminal, and the other terminal of the second capacitor is connected with the fourth node.

9. The display panel according to claim 8, wherein the plurality of conductive layers comprise an active layer, a gate metal layer, and a source-drain metal layer sequentially provided on the base substrate.

10. The display panel according to claim 9, wherein the plurality of conductive layers further comprise a light shielding layer provided between the base substrate and the active layer; the gate metal layer comprises at least one of a first gate metal layer and a second gate metal layer; and the source-drain metal layer comprises at least one of a first source-drain metal layer and a second source-drain metal layer.

11. The display panel according to claim 9, wherein an orthographic projection of the first electrode plate on the base substrate is within a range of an orthographic projection of the anode on the base substrate; and an orthographic projection of the second electrode plate on the base substrate is within a range of an orthographic projection of the anode on the base substrate.

12. The display panel according to claim 6, wherein on a plane perpendicular to the display panel, the display panel comprises a drive circuit layer provided on a base substrate, a light emitting structure layer provided on a side of the drive circuit layer away from the base substrate, and an encapsulation layer provided on a side of the light emitting structure layer away from the base substrate; the light emitting structure layer comprises an anode, a pixel definition layer, an organic light emitting layer, and a cathode;

the drive circuit layer comprises a plurality of conductive layers located between the base substrate and the anode; when at least one of the sub-pixels comprises the pixel circuit, the voltage stabilizing sub-circuit of the pixel circuit comprises a second capacitor, the second capacitor comprises a first electrode plate and a second electrode plate, wherein the first electrode plate is located on one of the plurality of conductive layers, and the second electrode plate is integrally provided with the anode; the storage sub-circuit of the pixel circuit comprises a first capacitor, one terminal of the first capacitor is connected with the first node, and the other terminal of the first capacitor is connected with the first voltage terminal; one terminal of the second capacitor is connected with the voltage stabilizing signal terminal, and the other terminal of the second capacitor is connected with the fourth node.

13. The display panel according to claim 9, wherein an orthographic projection of the first electrode plate on the base substrate is within a range of an orthographic projection of the anode on the base substrate.

14. The display panel according to claim 13, wherein a shape of the first electrode plate is the same as a shape of the anode.

15. A display device, comprising a display panel and a photosensitive element, wherein the display panel comprises a first display region and a second display region, the first display region at least partially surrounds the second display region, the photosensitive element is located in the second display region;

the display panel comprises a plurality of first light emitting elements and a plurality of second light emitting elements; the display panel further comprises a plurality of first pixel circuits configured to drive first light emitting elements to emit light and a plurality of second pixel circuits configured to drive second light emitting elements to emit light;

a second pixel circuit is the pixel circuit according to claim 1, and the second pixel circuit comprises a first sub-part which is a part other than the voltage stabilizing sub-circuit and a second light emitting element;

the first light emitting elements, the first pixel circuits and first sub-parts of the plurality of second pixel circuits are located in the first display region, and the first sub-parts of the plurality of second pixel circuits are distributed among the plurality of first pixel circuits; and voltage stabilizing sub-circuits and the plurality of second light emitting elements are located in the second display region.

16. A method for driving a pixel circuit, which is used for driving the pixel circuit according to claim 1, and comprises:

resetting, by the reset sub-circuit, the first node and the anode terminal of the light emitting element under control of signals of the reset control signal terminal and the scan signal terminal;

writing, by the writing sub-circuit, the signal of the data signal terminal into the second node under control of the signal of the scan signal terminal;

storing, by the storage sub-circuit, the voltage of the first node;

stabilizing, by the voltage stabilizing sub-circuit, the voltage of the anode terminal of the light emitting element through the signal of the voltage stabilizing signal terminal; and providing, by the drive sub-circuit, the driving current to the light emitting element under control of signals of the first node and the second node.

17. The display panel according to claim 9, wherein the gate metal layer includes a first gate metal layer and a second gate metal layer, the first electrode plate is located on the first gate metal layer and the second electrode plate is located on the second gate metal layer.

18. The display panel according to claim 10, wherein the first electrode plate is located on the light shielding layer and the second electrode plate is located on the active layer.

19. The display panel according to claim 12, wherein the plurality of conductive layers comprise a second source-drain metal layer, the first electrode plate is located on the second source-drain metal layer and the second electrode plate is located on an anode layer.

* * * * *